(12) United States Patent
Prechtl

(10) Patent No.: US 8,941,148 B2
(45) Date of Patent: Jan. 27, 2015

(54) SEMICONDUCTOR DEVICE AND METHOD

(75) Inventor: Gerhard Prechtl, St. Jakob i. Rosenthal (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/413,331

(22) Filed: Mar. 6, 2012

(65) Prior Publication Data

US 2013/0234146 A1   Sep. 12, 2013

(51) Int. Cl.
*H01L 29/66* (2006.01)
*H01L 29/15* (2006.01)
*H01L 31/0256* (2006.01)

(52) U.S. Cl.
USPC 257/194; 257/76; 257/E29.246; 257/E21.407

(58) Field of Classification Search
USPC .................. 257/194, E29.246, E29.249, 76, 257/E21.403, E21.407
See application file for complete search history.

(56) References Cited

U.S. PATENT DOCUMENTS

| | | | |
|---|---|---|---|
| 6,586,781 B2 | 7/2003 | Wu et al. | |
| 7,250,641 B2 | 7/2007 | Saito et al. | |
| 7,332,795 B2 | 2/2008 | Smith et al. | |
| 2007/0018198 A1* | 1/2007 | Brandes et al. | 257/183 |
| 2007/0018199 A1* | 1/2007 | Sheppard et al. | 257/200 |
| 2007/0205433 A1* | 9/2007 | Parikh et al. | 257/192 |
| 2007/0254418 A1* | 11/2007 | Sheppard et al. | 438/172 |
| 2008/0093626 A1* | 4/2008 | Kuraguchi | 257/190 |
| 2009/0146185 A1 | 6/2009 | Suh | |
| 2010/0090225 A1* | 4/2010 | Sato | 257/76 |
| 2010/0224911 A1* | 9/2010 | Okita et al. | 257/194 |
| 2011/0127541 A1* | 6/2011 | Wu et al. | 257/76 |

OTHER PUBLICATIONS

Seug-Chul Lee, et al: "An AlGaN/GaN Hemt Power Switch Employing a Field Plate and a Floating Gate", Phys. Scr. T126, 2006 65-67.
Ki-Yeol Park, et al: "Thermally Stable AlGAN/GaN Heterostructure Field-Effect Transistor with IrO2 Gate Electrode", J. Vac., Sci. Technology B, vol. 24, No. 3, May 1, 2006 1303-1307.
Sugiura, et al: "Fabrication of Normally-Off Mode GaN and AlGan/GaN MOSFETs with HfO2 Gate Insulator", Solig-State Electronics 54, 2010, 79-83.
Eldad Bahat-Treidel, et al: "Punchtrough-Voltage Enhancement of AlGaN/GaN HEMTs Using AlGaN Double-Heterojunction Confinement", IEEE Transactions on Electron Devices, vol. 55, No. 12, Dec. 2008, 3354-3359.
U.K. Mishra, P. Parikh, Y.F. Wu: AlGaN/GaN HEMTS: An Overview of Device Operation and Applications, Feb. 24, 2009.

* cited by examiner

*Primary Examiner* — Mary Wilczewski
*Assistant Examiner* — Erik T Peterson
(74) *Attorney, Agent, or Firm* — Dicke, Billig & Czaja, PLLC

(57) ABSTRACT

A semiconductor device is disclosed. One embodiment includes a lateral HEMT (High Electron Mobility Transistor) structure with a heterojunction between two differing group III-nitride semiconductor compounds and a layer arranged on the heterojunction. The layer includes a group III-nitride semiconductor compound and at least one barrier to hinder current flow in the layer.

22 Claims, 6 Drawing Sheets

SEMICONDUCTOR DEVICE AND METHOD

BACKGROUND

Semiconductor devices may be based on different semiconductor materials, for example, silicon, gallium-arsenide and group III nitrides. Different semiconductor materials may lend themselves for use for some applications better than for other applications due to their intrinsic properties and/or ease of processing.

A group III-nitride-based semiconductor device, in which gallium nitride is used as part of the semiconductor materials, has a larger bandgap and a higher critical field compared to the semiconductor device which uses silicon as the main material.

By way of example, a group III-nitride-based semiconductor device may include an aluminium gallium nitride/gallium nitride heterostructure field effect transistor or a High Electron Mobility Transistor (HEMT). Such devices may be formed by depositing layers of appropriate composition and thickness epitaxially on a substrate such as a sapphire substrate or a silicon carbide substrate.

A group III-nitride-based semiconductor device may provide a semiconductor device having a low on-resistance and low loss. Such semiconductor devices may be useful for power control, for example.

SUMMARY

A semiconductor device includes a lateral HEMT structure with a heterojunction between two differing group III-nitride semiconductor compounds and a layer arranged on the heterojunction. The layer includes a group III-nitride semiconductor compound and at least one barrier to hinder current flow in the layer.

BRIEF DESCRIPTION

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
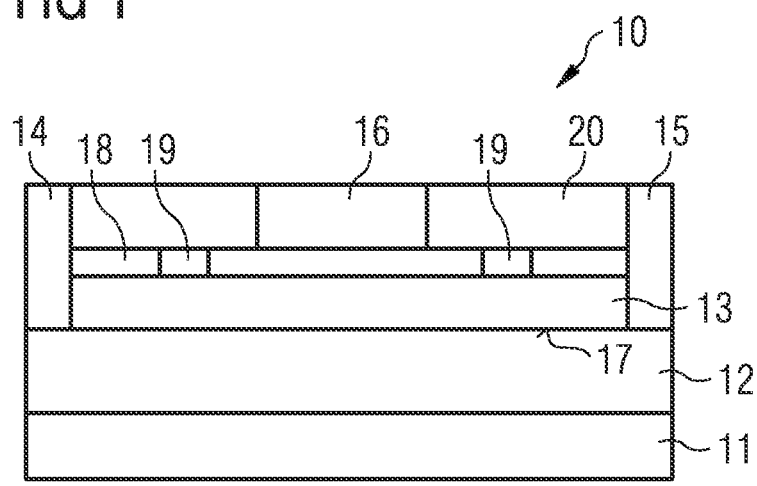
FIG. 1 illustrates one embodiment of a cross-sectional view of a semiconductor device.

FIG. 1 illustrates a semiconductor device 10 according to one embodiment. The semiconductor device 10 includes a substrate 11, a first layer 12 including a group III nitride semiconductor compound positioned on the substrate 11, a second layer 13 positioned on the first layer 12, a first load electrode 14, a second load electrode 15 and a control electrode 16. The second layer 13 also includes a group III-nitride semiconductor compound. However, the group III-nitride semiconductor compounds of the first layer 12 and second layer 13 differ from one another and provide a heterojunction 17 at the interface between the first layer 12 and the second layer 13.

A group III nitride semiconductor compound includes one or more elements of group III of the periodic table of elements and nitrogen. Examples of elements of group III of the periodic table of elements are boron gallium, aluminium, indium and thallium. Examples of group III nitride semiconductor compound include GaN and $(Al_{1-x}Ga_x)N$.

The first load electrode 14 extends through the second layer 13 and is in contact with the first layer 12. The second load electrode 15 extends through the second layer 13 and is in contact with the first layer 12. The control electrode 16 is positioned laterally between the first load electrode 14 and the second load electrode 15.

The semiconductor device 10 further comprises a third layer 18, which includes a group III-nitride semiconductor compound. The third layer 18 is positioned on the second layer 13 and the control electrode 16 is positioned on the third layer 18. The third layer 18 may serve as a cap layer which serves to protect the underlying second layer 13 from corrosive environments.

The third layer 18 includes at least one barrier 19. The barrier 19 includes a dielectric material and is positioned between the first load electrode 14 and the control electrode 16 and between the control electrode 16 and the second load electrode 15.

The heterojunction 17, the first load electrode 14, second load electrode 15 and control electrode 16 provide a lateral HEMT (High Electron Mobility Transistor) structure.

The semiconductor device further includes a passivation layer 20, which is positioned on the third layer 18 and covers the regions between the first load electrode 14, the second load electrode 15 and the control electrode 16.

High Electron Mobility Transistors (HEMTs) have a source, a gate and a drain behave much like Field Effect Transistors (FET's). A conducting channel between the drain and source electrodes can be affected by applying a voltage to the gate electrode. This causes modulation of the drain-source current. In a HEMT, the conducting channel is created by a hetero structure, which in the example illustrated in FIG. 1 is provided by the first layer 12 and the second layer 13. The hetero-structure confines the charge carriers to a thin layer at the junction between the first layer 12 and the second layer 13 forming a 2 dimensional electron gas (2DEG). The concentration of the carriers and their speed in this layer enables the transistor to maintain a high gain at very high frequencies.

The barrier 19 extends throughout the thickness of the third layer 18 and interrupts the entire thickness of the third layer 18. The barrier 19 forms an interface with the underlying second layer 13 and with the overlaying passivation layer 20. The group III-nitride semiconductor compound of the third layer 18 is discontinuous in regions positioned adjacent the control electrode 16 due to the extent of the barrier 19 throughout the thickness of the third layer 18.

The barrier 19 serves to hinder current flow in the third layer 18 and to hinder leakage current between the control electrode 16 and the first load electrode 14 and between the control electrode 16 and the second load electrode 15. The barrier 19 provides an obstacle to current flow in the third layer 18 as it interrupts the lateral extent of the conductive material of the third layer 18 by the position of a dielectric, non-electrically conductive region throughout the thickness of the third layer 18.

In some embodiments, the barrier 19 extends through the entire thickness of the third layer 18. In some embodiments, the barrier extends only partially through the thickness of the third layer 18 and the third layer has a portion of its thickness that is continuous between the control electrode 16 and the first load electrode 14 and continuous between the control electrode 16 and the second load electrode 15. Due to thinning of the third layer 18, the leakage is also decreased.

In some embodiment the barrier 19 has a height that is greater than the thickness of the third layer 18 and may extend throughout the entire thickness of the third layer 18 and protrude above or below the third layer 18.

The barrier 19 may have various forms when viewed from above. The barrier 19 may be a single ring which entirely and continuously encircles the control electrode 16 in the plane of the third layer 18. In other embodiments, the third layer 18 includes a plurality of barriers 19, which are positioned adjacent the control electrode 16 in the plane of the third layer 18. This plurality of barriers may be arranged such that each barrier extends over the entire thickness of third layer 18, so as to disrupt the continuity of the third layer 18 in this area. The plurality of barriers 19 may be laterally spaced from one another by portions of third layer 18.

In some embodiments, the group III-nitride semiconductor compound of the first layer 12 is gallium nitride, the group III-nitride semiconductor compound of the second layer 13 is aluminium gallium nitride and the group III-nitride semiconductor compound of the third layer 18 may be gallium nitride. As used herein, aluminium gallium nitride refers to the compound in which part of gallium has been replaced by aluminium, for example $(Al_xGa_{1-x})N$, wherein x may lie in the range $0<x\leq0.5$. In some embodiments, x=0.25.

The barrier 19 and the passivation layer 20 may comprise the same or differing materials. Suitable materials include non-electrically conductive nitrides such as SiN.

The electrodes may comprise one or more metals and may have a multilayer structure, for example, Ti/Al/Ni/Au. The passivation layer may be silicon nitride.

The substrate 11 may be a material which is selected to support epitaxial growth of gallium nitride upon its surface. The substrate 11 may include sapphire, silicon carbide or silicon example, <100> silicon.

Figure 2:
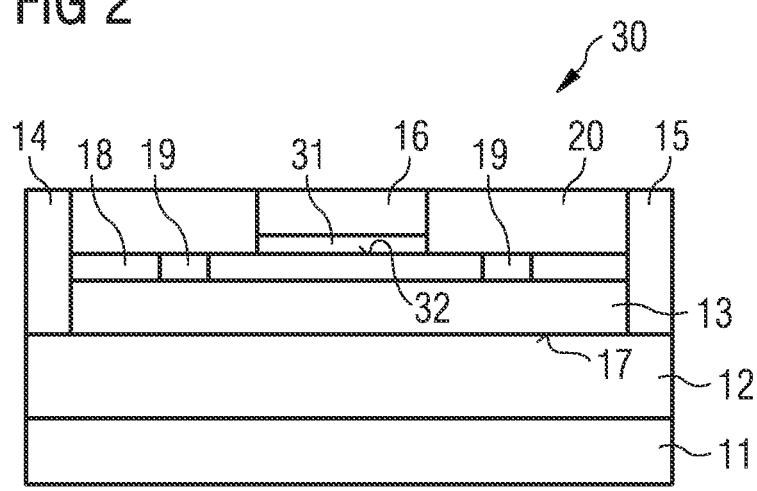
FIG. 2 illustrates one embodiment of a cross-sectional view of a semiconductor device.

FIG. 2 illustrates a semiconductor device 30 according to one embodiment. The semiconductor device 30 includes a substrate 11, a heterojunction 17 between a first layer 12 and a second layer 13, each including differing group III-nitride semiconductor compounds. The semiconductor device 30, also includes a first load electrode 14 laterally spaced at a distance from a second load electrode 15 and a control electrode 16, which is positioned between the first load electrode 14 and second load electrode 15.

The semiconductor device also includes a third layer 18 of a group III-nitride semiconductor compound, which is positioned on the second layer 13. Similar to the embodiment illustrated in FIG. 1, third layer 18 includes a dielectric barrier 19 which interrupts the entire thickness of the third layer 18 in regions adjacent the control electrode 16. The heterojunction 17, the first load electrode 14, second load electrode 15 and the control electrode 16 provide a lateral HEMT structure.

The semiconductor device 30 illustrated in FIG. 2, differs from the semiconductor device 10 illustrated in FIG. 1 by the arrangement of a gate oxide layer 31, at the interface between an electrically conductive metal providing the control electrode 16 and an upper surface 32 of group III-nitride semiconductor compound portions of the third layer 18.

Figure 3:
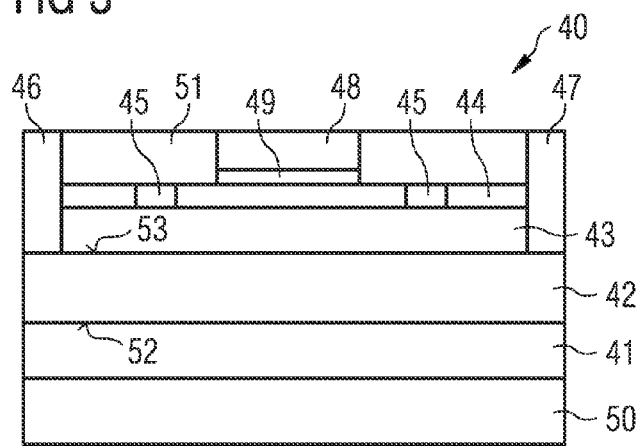
FIG. 3 illustrates one embodiment of a cross-sectional view of a semiconductor device.

FIG. 3 illustrates one embodiment of a partial cross-sectional view of a semiconductor device 40 including a double heterojunction confinement HEMT structure. The semiconductor device 40 includes a layer 41 including aluminium gallium nitride positioned on a substrate 50, a layer 42 of gallium nitride positioned on the layer 41 and a layer 43 including aluminium gallium nitride positioned on the gallium nitride layer 42. The layer 42 including gallium nitride is sandwiched between the two layers 41 and 43, each including aluminium gallium nitride. Two heterojunctions are provided. One heterojunction 52 is formed at the interface between the layer 41 and the layer 42 and a second heterojunction 53 is formed at the interface between the layer 43 and the layer 42.

The semiconductor device 40 further includes a cap layer 44 positioned on the layer 43. The cap layer 44 includes gallium nitride and a barrier, 45, which includes a dielectric material. The barrier 45 extends throughout the thickness of the cap layer 44, such that the cap layer 44 is discontinuous in regions occupied by the barrier 45. The barrier 45 forms interfaces with the underlying gallium nitride layer 43 and with an overlying passivation layer 51.

The semiconductor device 40 includes a source electrode 46, providing a first load electrode, a drain electrode 47, providing a second load electrode, which is spaced apart from, and positioned laterally to, the source electrode 46. The semiconductor device 40 further includes a gate electrode 48 arranged laterally between the source electrode 46 and the drain electrode 47. In this embodiment, a gate oxide 49 is positioned between the gate electrode 48 and the upper surface of the cap layer 44. The barrier 45 is positioned in the cap layer 44 and adjacent the gate electrode 48 and laterally positioned between the gate electrode 48 and the source electrode 46 and the drain electrode 47.

The barrier 45 may have the form of a continuous ring which encircles the gate electrode 48. In some embodiments, the barrier 45 may comprise a plurality of discrete portions arranged in the plane of the cap layer 44 which are spaced apart from one another by regions including the gallium nitride of the cap layer 44.

The semiconductor device 40 also includes the passivation layer 51, which is positioned on the cap layer 44 and on the barrier 45 in regions positioned between the source electrode 46, gate electrode 48 and drain electrode 47.

Figure 4:
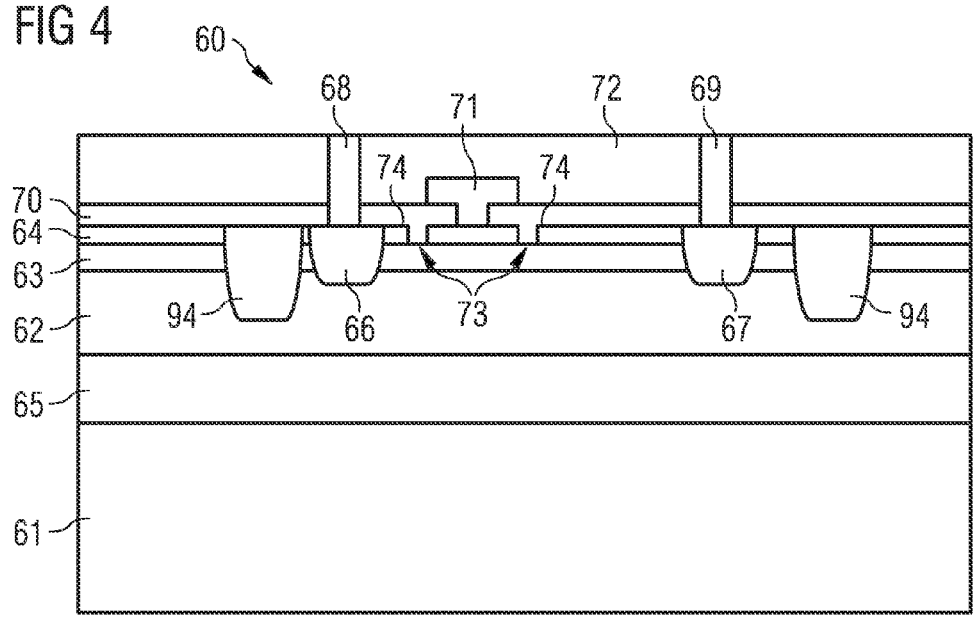
FIG. 4 illustrates one embodiment of a cross-sectional view of a semiconductor device.

FIG. 4 illustrates one embodiment of a partial cross-sectional view of a lateral HEMT device 60. The device 60 includes a substrate 61, a first gallium nitride layer 62 positioned on the substrate, 61, a aluminium gallium nitride layer 63 positioned on the gallium nitride layer 62 and a second gallium nitride layer 64 positioned on the aluminium gallium nitride layer 63.

In this embodiment, the device 60 further includes a gallium nitride buffer layer 65, which is positioned between the substrate 61 and the first gallium nitride layer 62. The buffer layer 65 may serve, for example, as a nucleation layer and/or stress compensation layer in order to allow the epitaxial growth of gallium nitride on lattice mismatched substrates such as sapphire or silicon. The device 60 includes a doped source region 66, which extends through the second gallium nitride layer 64, the aluminium gallium nitride layer 63 and into the first gallium nitride layer 62. The doped source region 66 may be fabricated by implantation, for example.

The device 60 further includes a doped drain region 67, which like the doped source region 66 extends through the thickness of the second gallium nitride layer 64, the aluminium gallium nitride layer 63 and into the first gallium nitride layer 62. The doped drain region 67 may be fabricated by implantation, for example.

The device 60 further includes a source electrode 68 which is in electrical contact with the doped source region 66 and a drain electrode 69, which is in electrical contact with the doped drain region 67. The source electrode 68 and the drain electrode 69 include one or more metals. The device 60 further includes a nitride layer 70, which is positioned on the second gallium nitride layer 64, a gate electrode 71 and an oxide passivation layer 72. The gate electrode 71 is positioned laterally between the source electrode 68 and the drain electrode 69 and is positioned on the upper surface of the nitride layer 70 and includes a portion which extends through the thickness of the nitride layer 70, so that it is in contact with the upper surface of the second gallium nitride layer 64. The gate electrode 71 has a general T shape in cross-section.

The oxide passivation layer 72 covers the gate electrode 71 in this region of device 60 and the nitride layer 70. The source electrode 68 and the drain electrode 69 each extend through the oxide passivation layer 72 and the nitride layer 70. The gate electrode 71 is in Schottky contact with the second gallium nitride layer 64.

The device 60 further includes a barrier structure 73 in the form of one or more trenches 74 which extend through the thickness of the second gallium nitride layer 64. The trench or trenches are filled with an electrically non-conductive material such as a non-electrically conductive nitride. The trench 74 is positioned adjacent the gate electrode 71 and interrupts the continuity of the gallium nitride layer 64 in regions adjacent the gate electrode 71. The trench 74 interrupts the continuity of the second gallium nitride layer 64 in regions between the doped source region 66, the source electrode 68 and the gate electrode 71 and in regions of the second gallium nitride layer 64 positioned between the gate electrode 71 and the doped drain region 67 and drain electrode 69. The barrier structure 73 may be considered to be provided by protruding portions of the nitride layer 70, which extend through the thickness of the second gallium nitride layer 64 and are in direct contact with the underlying aluminium gallium nitride layer 63.

The device 60 further includes electrical insulation in the form of a well 94 formed by selective argon implantation. The well 94 has the form of a continuous, uninterrupted ring which surrounds the active part of the device 60. The argon implanted well 94 extends through the thickness of the second gallium nitride layer 64, the aluminium gallium nitride layer 63 and into the first gallium nitride layer 62. The well 94 penetrates deeper into the first gallium nitride layer 62 than the doped source region 66 and the doped drain region 67. Portions of the well 94 in regions of the device 60 not illustrated in FIG. 4 are in contact with the barrier structure 73.

Figure 5:
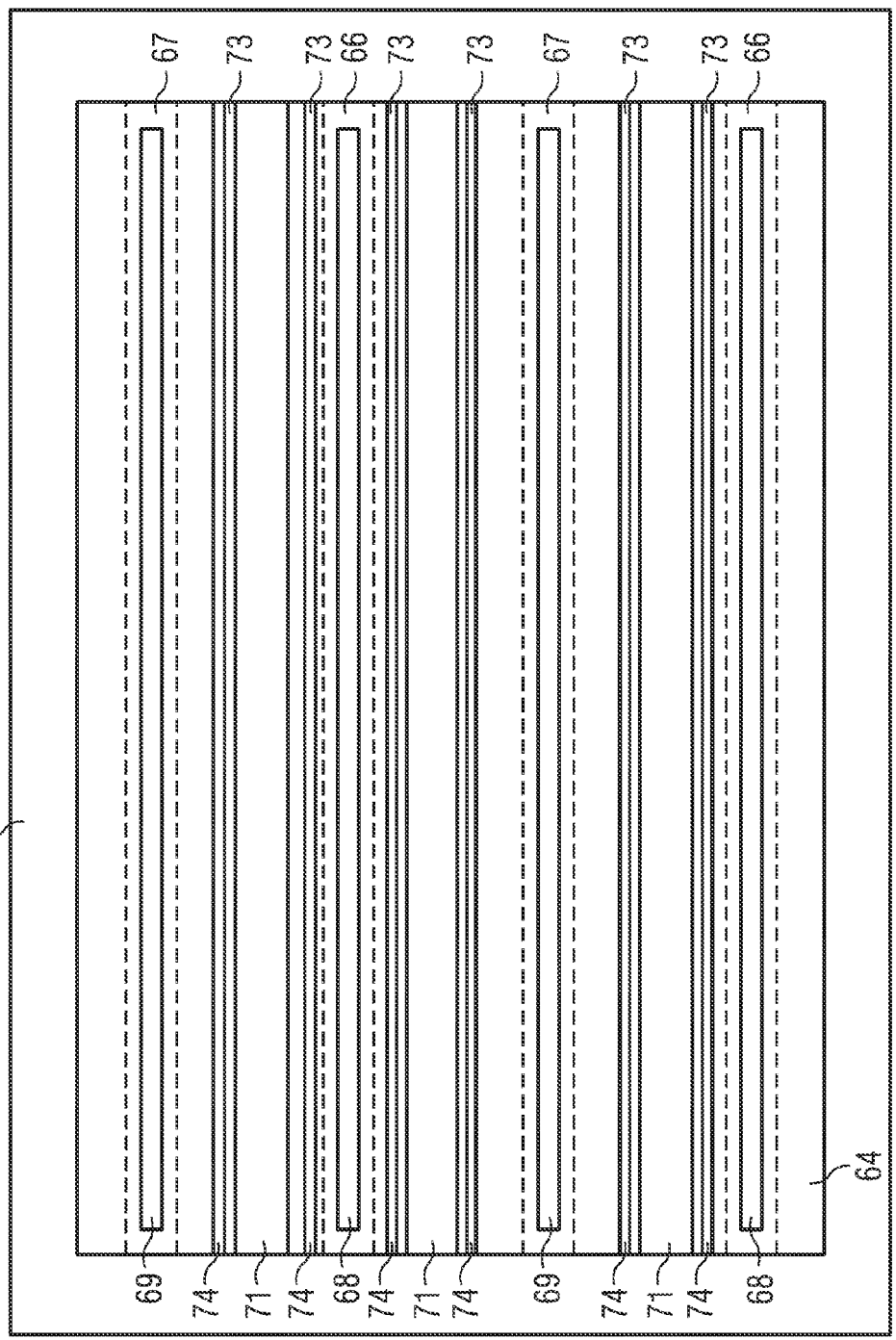
FIG. 5 illustrates one embodiment of a top view of a semiconductor device.

FIG. 5 illustrates one embodiment of a top view of the device 60 illustrated in FIG. 4. As is illustrated in FIG. 5, the source electrode 68, doped source region 66, gate electrode 71, drain electrode 69 and doped drain region 67, each have an elongate, strip form when viewed from above and are arranged generally parallel to one another. The barrier structure 73 includes two elongate trenches 74 which are arranged adjacent and, spaced a short distance from, either side of the long sides of the gate electrode 71, such that they extend over the entire length of the gate electrode 71 and interrupt the continuity of the gallium nitride layer 64 along its entire length in regions between the gate electrode 71 and the doped source region 66 and doped drain region 67. The trenches 74 are filled with an electrically insulating material.

The second gallium nitride layer 64 may be considered to comprise a plurality of strips which are separated from one another by the strips of the barrier structure 73. The lateral extent of the metal source electrode 68 and metal drain electrode 69 is less than the lateral extent of the doped source region 66 and doped drain region 67, respectively. The trenches 74 of the barrier structure 73 are laterally positioned nearer to the gate electrode 71 than to the source electrode 68 and the drain electrode 69. The barrier structure 73 is terminated by the isolation well 94 to avoid a lateral leakage path in the second gallium nitride layer 64.

Figure 6:
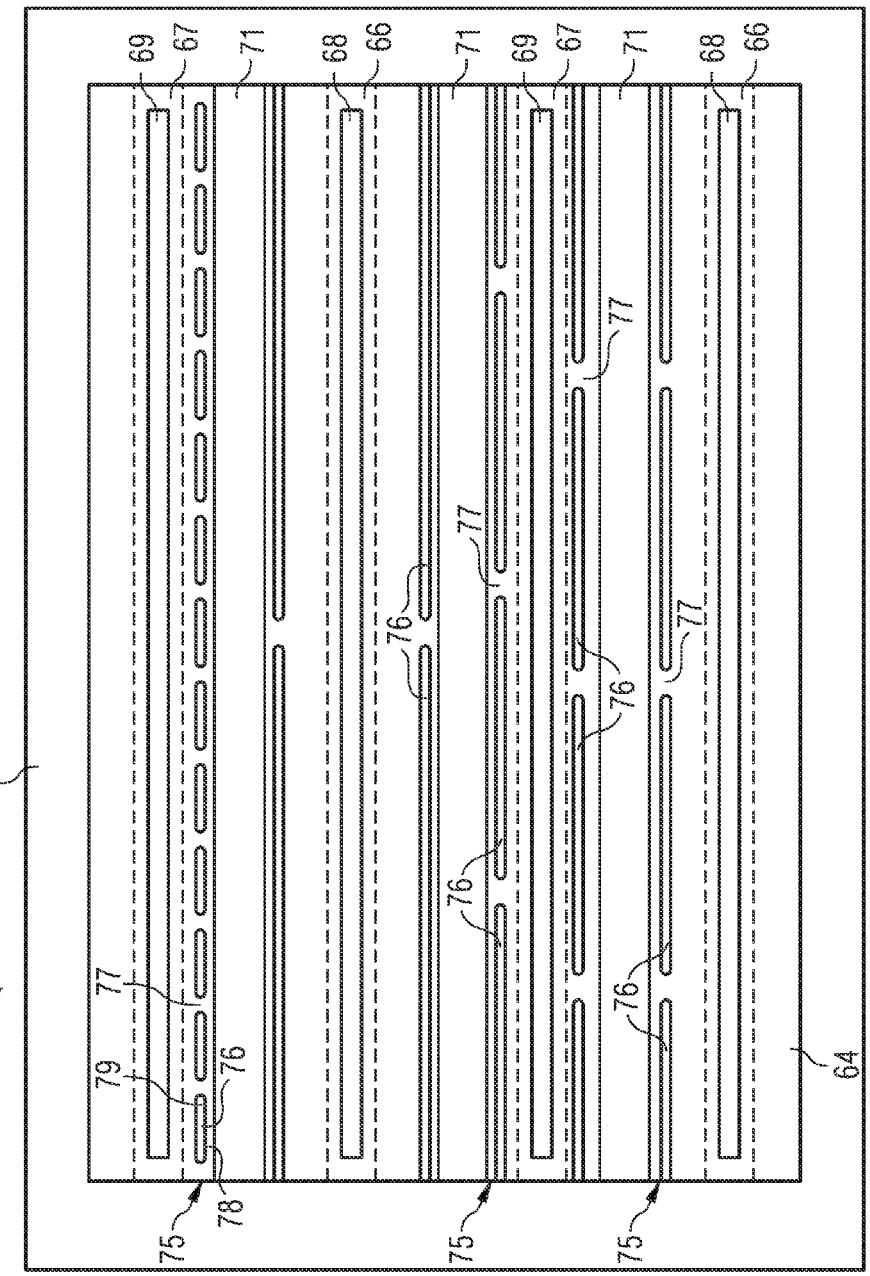
FIG. 6 illustrates one embodiment of a top view of a semiconductor device.

FIG. 6 illustrates one embodiment of a top view of a lateral HEMT device 60, including a plurality of barrier structures 75. Further features of the lateral HEMT device 60 illustrated in FIG. 6 correspond to those described in connection with FIGS. 4 and 5. The barrier structure 75 is positioned in the second gallium nitride layer 64 such that the thickness of the second gallium nitride layer 64 is entirely interrupted in regions occupied by the barrier structure 75. The barrier structure 75 is arranged adjacent the long sides of the gate electrode 71 such that the barrier structure 75 is positioned between the gate electrode 71 and the doped source region 66 and between the gate electrode 71 and the doped drain region 67.

In contrast to the barrier structure illustrated in FIG. 5, the barrier structure 75 comprises a plurality of strip regions 76 arranged in a row such that adjacent portions of the strip regions 76 are spaced at a distance from one another by portions 77 of the second gallium nitride layer 64.

The strip portions 76 each include a trench 78 extending through the thickness of the gallium nitride layer 64 which is filled with a non-electrically conductive material 79 such as a non-electrically conductive oxide or nitride.

The barrier structures 75 illustrated in FIG. 5 have differing numbers of strip regions 76. In some embodiments, two strip portions 76 are provided. In other embodiments, more than two strip portions 76 are provided, for example, 4 and 13. However, a greater number or fewer strip portions may be provided.

A lateral HEMT device may include a plurality of barrier structures 75, each having the same number of strip regions 76. In some embodiments, a lateral HEMT device includes a plurality of barrier structures 75, having differing numbers of strip regions 76.

Figure 7:
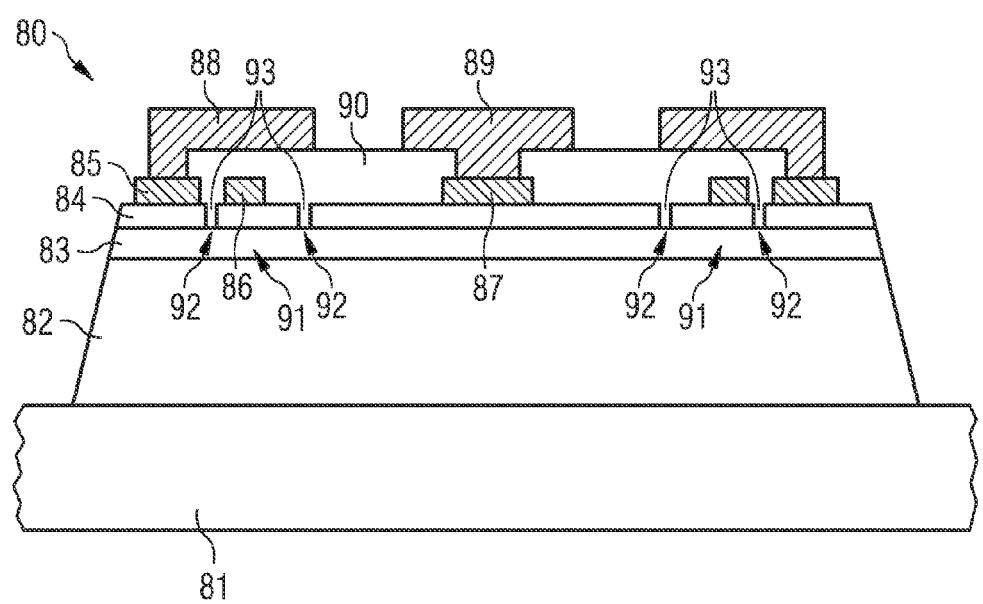
FIG. 7 illustrates one embodiment of a cross-section of a semiconductor device.

FIG. 7 illustrates one embodiment of a partial cross-sectional view of a semiconductor device 80 including a lateral HEMT structure. The semiconductor device 80 includes a silicon substrate 81, a gallium nitride layer 82, positioned on the silicon substrate 81, an aluminium gallium nitride layer 83 positioned on the gallium nitride layer 82 and a second gallium nitride layer 84 positioned on the aluminium gallium nitride layer 83. The semiconductor device 80 further includes a source electrode 85, a gate electrode 86 and a drain electrode 87. The gate electrode 86 is positioned laterally between the source electrode 85 and the drain electrode 87.

An insulating film 90 is positioned on the second gallium nitride layer 84. The insulating film 90 may be an electrical insulator. The insulating film 90 extends between the source electrode 85 and drain electrode 87 covering the gate electrode 86. The second gallium nitride layer 84 comprises an interception structure 91 comprising trenches 92 filled with portions 93 of the insulating film 90. The trenches extend throughout the thickness of the gallium nitride layer 84 and the portions 93 of the insulating film 90 form interfaces with the underlying aluminium gallium nitride layer 83. Also illustrated in FIG. 7 are a first field plate electrode 88, which is electrically connected to the source electrode 85, and a second field plate electrode 89, which is electrically connected to the drain electrode 87.

Figure 8:
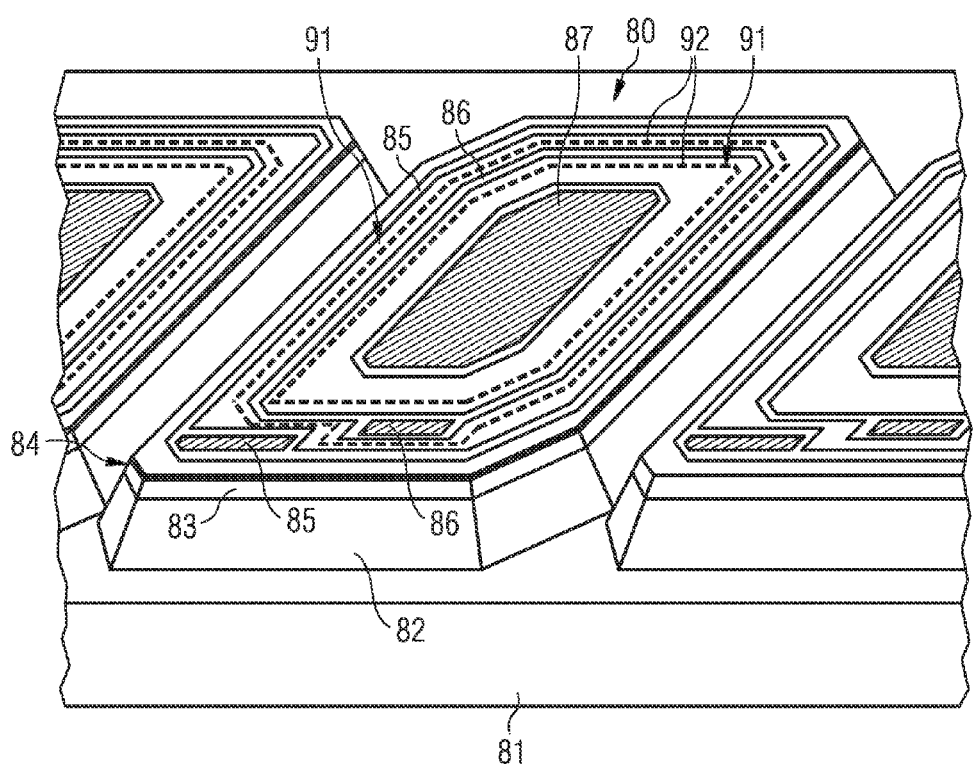
FIG. 8 illustrates one embodiment of a perspective top view of a semiconductor device.

FIG. 8 illustrates one embodiment of a perspective top view of the semiconductor device 80. In the perspective top view, it can be seen that the source electrode 85 and the gate electrode 86 have the form of a ring and surround the drain electrode 87. The interception structure 91 is illustrated with dashed lines in FIG. 8 for ease of understanding. Each of the two trenches 92 of the interception structure 91 is illustrated by a dashed line. The two trenches 92 are positioned adjacent each side of the ring-shaped gate electrode 86.

The trenches 92 have the form of a continuous uninterrupted ring that encircles the gate electrode 86 and the drain electrode 87 and provide a continuous barrier filled with insulating material in the gallium nitride layer 84 between the source electrode 85 and the gate electrode 86 and a continuous barrier filled with insulating material in the second gallium nitride layer 84 between the gate electrode 86 and the drain electrode 87. The trenches 92 are laterally positioned nearer to the gate electrode 86 than to the source electrode 85 and to the drain electrode 87.

In other embodiments, the interception structure comprises two discontinuous rings, each discontinuous ring comprising two or more portions. Each portion is provided by a trench filled with portions of the insulating film.

A method for fabricating a semiconductor device is also provided. The method may be used to fabricate one or more of the semiconductor device according to one of the previously described embodiments. A substrate is provided, which is capable of supporting epitaxial growth of gallium nitride. Suitable substrates may be sapphire, silicon carbide <100> silicon, for example. A layer of gallium nitride is deposited on the substrate followed by a layer of aluminium gallium nitride and a further gallium nitride layer. Portions of the gallium nitride layer are selectively removed to create trenches in regions of the further gallium nitride layer, which, in the finished device, are positioned adjacent a gate electrode and, in particular, between a gate electrode and a source electrode and between the gate electrode and a drain electrode. An electrically insulating layer is deposited into the trenches. The source electrode, the gate electrode and the drain electrode are then deposited.

The at least one trench is formed by selective etching of the further gallium nitride layer. The etching may be carried out so that the base of the trench is provided by the upper surface of the aluminium gallium nitride layer. In some embodiments, the etching is carried out such that the base of the trench penetrates into the aluminium gallium nitride layer or such that the base is positioned in the further gallium nitride layer above the aluminium gallium nitride layer.

The gate electrode may be deposited onto the third group III-nitride semiconductor layer. In some embodiments, an oxide layer is deposited onto the third group III-nitride semiconductor layer at the position of the control electrode and the control electrode is deposited on the oxide layer.

In some embodiment, second trenches are formed which extend through the further gallium nitride layer and through the aluminium gallium nitride layer such that a region of the gallium nitride layer is exposed at a base of the second trenches. Electrically conductive material is deposited into the second trenches and at least one first load electrode and at least one second load electrode is formed.

Although the embodiments described herein refer to a single lateral HEMT, a plurality of lateral HEMTs may be fabricated and provided on a single substrate.

The order of the method may be reversed so that the source electrode, the gate electrode and the drain electrode may be formed first, and afterwards the trenches are formed in the gallium nitride layer. An electrical insulating layer may then be deposited to fill these trenches and to cover the gate electrode. The electrical insulating layer may extend between the source electrode and the drain electrode.

The gallium nitride and aluminium gallium nitride layers may be deposited epitaxially by methods including molecular beam epitaxy (MBE) and/or metalorganic chemical vapour deposition (MOCVD).

As used herein, the singular forms "a", "an" and "the" are intended to include the plural forms as well, unless the context clearly indicates otherwise. It will be further understood that the terms "includes" and/or "including" when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a lateral HEMT structure comprising a first load electrode, a second load electrode, a control electrode, a heterojunction between two differing group III-nitride semiconductor compounds, and
   a layer arranged on the heterojunction, the layer comprising a group III-nitride semiconductor compound and at least one barrier to hinder leakage current flow in the layer between the control electrode and the first and second load electrodes, the barrier surrounded on two sides by and spaced from the control electrode by the group III-nitride semiconductor compound so that the barrier is not in contact with the control electrode.

2. The semiconductor device according to claim 1, wherein the barrier is arranged between the control electrode and at least one of the first load electrode and the second load electrode.

3. The semiconductor device according to claim 1, wherein the barrier comprises a dielectric material.

4. The semiconductor device according to claim 1, wherein the barrier extends through the entire thickness of the layer.

5. The semiconductor device according to claim 1, wherein the barrier extends only partially through the thickness of the layer.

6. The semiconductor device according to claim 1, wherein the barrier extends through the entire thickness of the layer and protrudes from the layer.

7. The semiconductor device according to claim 1, wherein the layer comprises a ring-shaped continuous barrier encircling the control electrode in a plane of the layer.

8. The semiconductor device according to claim 1, wherein the layer comprises a plurality of barriers positioned adjacent the control electrode in a plane of the layer.

9. A semiconductor device, comprising:
- a first load electrode;
- a second load electrode;
- a control electrode;
- a first group III-nitride semiconductor layer;
- a second group III-nitride semiconductor layer arranged on the first group III-nitride semiconductor layer; and
- a third layer comprising a group III-nitride semiconductor compound arranged on the second group III-nitride semiconductor layer and a dielectric region positioned in the third layer, the dielectric region spaced from the control electrode by a portion of the third layer and locally interrupting a continuity of the third layer to hinder a flow of leakage current between the control electrode and the first and second load electrodes,
- wherein the first load electrode and the second load electrode are in contact with the first group III-nitride semiconductor layer and the control electrode is in contact with the second group III-nitride semiconductor layer.

10. The semiconductor device according to claim 9, wherein the dielectric region extends entirely through the entire third layer so that the third layer is discontinuous in a region extending between the first load electrode and the control electrode.

11. The semiconductor device according to claim 9, wherein the dielectric region extends entirely through the entire third layer so that the third layer is discontinuous in a region extending between the second load electrode and the control electrode.

12. The semiconductor device according to claim 9, wherein
- the first group III-nitride layer is a GaN layer,
- the second group III-nitride layer is a $Al_xGa_{1-x}N$ layer,
- the group III-nitride semiconductor compound of the third layer is GaN.

13. The semiconductor device according to claim 9, further comprising a passivation layer arranged on the third layer.

14. The semiconductor device according to claim 9, further comprising a substrate.

15. The semiconductor device according to claim 14, wherein the substrate comprises one of the group consisting of sapphire, silicon carbide and <100> silicon.

16. The semiconductor device according to claim 14, further comprising a buffer layer arranged between the substrate and the semiconductor device.

17. A semiconductor device comprising:
- a lateral HEMT, including a heterojunction formed between two differing group III-nitride semiconductors; and
- a barrier for reducing leakage current in a cap layer between a control electrode and a first load electrode, the barrier positioned within the cap layer and underneath the cap layer and spaced from the control electrode by a portion of the cap layer so that the barrier is not in contact with the control electrode.

18. The semiconductor device according to claim 17, wherein the barrier is disposed within the cap layer to reduce leakage current between the control electrode and a second load electrode.

19. The semiconductor device according to claim 1, further comprising:
- a passivation layer arranged on the barrier,
- wherein the barrier forms an interface with one of the two differing group III-nitride semiconductor compounds and the passivation layer.

20. The semiconductor device according to claim 1, wherein the layer comprises a plurality of barriers laterally spaced from one another by the group III-nitride semiconductor compound.

21. The semiconductor device according to claim 1, further comprising:
- a well extending into the two differing group III-nitride semiconductor compounds to provide electrical insulation for the lateral HEMT.

22. A semiconductor device, comprising:
- a source electrode having an elongate, strip form;
- a drain electrode having an elongate, strip form;
- a gate electrode having an elongate, strip form;
- a first group III-nitride semiconductor layer;
- a second group III-nitride semiconductor layer arranged on the first group III-nitride semiconductor layer; and
- a third layer comprising a group III-nitride semiconductor compound arranged on the second group III-nitride semiconductor layer and a barrier structure arranged in the third layer and spaced from the gate electrode by a portion of the third layer so that the barrier is not in contact with the gate electrode, the barrier structure locally interrupting a continuity of the third layer, the barrier structure including two elongate trenches arranged adjacent and spaced a distance from either side of the long sides of the gate electrode.

* * * * *